(12) United States Patent
Kim et al.

(10) Patent No.: US 7,084,495 B2
(45) Date of Patent: Aug. 1, 2006

(54) ELECTROOSMOTIC PUMPS USING POROUS FRITS FOR COOLING INTEGRATED CIRCUIT STACKS

(75) Inventors: Sarah E. Kim, Portland, OR (US); R. Scott List, Beaverton, OR (US); James G. Maveety, San Jose, CA (US); Alan M. Myers, Menlo Park, CA (US); Quat T. Vu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 10/687,127

(22) Filed: Oct. 16, 2003

(65) Prior Publication Data

US 2005/0085018 A1  Apr. 21, 2005

(51) Int. Cl.
*H01L 23/34* (2006.01)

(52) U.S. Cl. .................. 257/713; 257/467; 257/468; 257/625; 257/675; 257/706; 257/707; 257/712; 257/714; 257/715; 257/716

(58) Field of Classification Search .............. 257/468, 257/625, 675, 706–707, 712–716, 467
See application file for complete search history.

(56) References Cited

U.S. PATENT DOCUMENTS

| | | | | |
|---|---|---|---|---|
| 4,536,824 A | * | 8/1985 | Barrett et al. | 361/694 |
| 4,639,829 A | * | 1/1987 | Ostergren et al. | 361/718 |
| 4,704,658 A | * | 11/1987 | Yokouchi et al. | 361/698 |
| 4,922,377 A | * | 5/1990 | Matsumoto et al. | 361/705 |
| 5,021,924 A | * | 6/1991 | Kieda et al. | 361/699 |
| 5,023,695 A | * | 6/1991 | Umezawa et al. | 257/714 |
| 5,105,430 A | | 4/1992 | Mundinger et al. | 372/35 |
| 5,166,863 A | * | 11/1992 | Shmunis | 361/699 |
| 5,168,348 A | * | 12/1992 | Chu et al. | 257/713 |
| 5,264,984 A | * | 11/1993 | Akamatsu | 361/689 |
| 5,361,188 A | * | 11/1994 | Kondou et al. | 361/695 |
| 5,365,400 A | * | 11/1994 | Ashiwake et al. | 361/752 |
| 5,420,753 A | * | 5/1995 | Akamatsu et al. | 361/719 |
| 5,436,501 A | * | 7/1995 | Ikeda | 257/714 |
| 5,724,729 A | * | 3/1998 | Sherif et al. | 29/840 |
| 5,754,399 A | * | 5/1998 | Wu | 361/699 |
| 5,844,208 A | * | 12/1998 | Tustaniwskyj et al. | 219/494 |

(Continued)

FOREIGN PATENT DOCUMENTS

WO   WO 02/094440   11/2002

OTHER PUBLICATIONS

List et al., U.S. Appl. No. 10/402,435, filed Mar. 28, 2003, entitled "Electroosmotic Pump Using Nanoporous Dielectric Frit".

(Continued)

*Primary Examiner*—Ida M. Soward
(74) *Attorney, Agent, or Firm*—Trop, Pruner & Hu, P.C.

(57) ABSTRACT

A stack of heat generating integrated circuit chips may be provided with intervening cooling integrated circuit chips. The cooling integrated circuit chips may include microchannels for the flow of the cooling fluid. The cooling fluid may be pumped using the integrated electroosmotic pumps. Removal of cooling fluid gases may be accomplished using integrated re-combiners in some embodiments.

24 Claims, 10 Drawing Sheets

U.S. PATENT DOCUMENTS

| | | | | |
|---|---|---|---|---|
| 5,983,997 | A | | 11/1999 | Hou .......................... 165/144 |
| 6,005,771 | A | * | 12/1999 | Bjorndahl et al. .......... 361/699 |
| 6,366,462 | B1 | * | 4/2002 | Chu et al. ................... 361/699 |
| 6,449,161 | B1 | * | 9/2002 | Duesman et al. ........... 361/719 |
| 6,548,894 | B1 | * | 4/2003 | Chu et al. ................... 257/706 |
| 6,661,661 | B1 | * | 12/2003 | Gaynes et al. .............. 361/705 |
| 2003/0062149 | A1 | | 4/2003 | Goodson et al. ....... 165/104.11 |
| 2003/0122245 | A1 | * | 7/2003 | Chu et al. ................... 257/706 |
| 2003/0164231 | A1 | | 9/2003 | Goodson et al. ....... 165/104.11 |
| 2004/0120827 | A1 | * | 6/2004 | Kim et al. .................... 417/48 |

OTHER PUBLICATIONS

Kim et al., U.S. Appl. No. 10/669,205, filed Sep. 24, 2003, entitled "Integrated Re-Combiner for Electroosmotic Pumps Using Porous Frits".

Kim et al., U.S. Appl. No. 10/698,749, filed Oct. 31, 2003, entitled "Using External Radiators with Electroosmotic Pumps for Cooling Integrated Circuits".

Kim et al., U.S. Appl. No. 10/323,084, filed Dec. 18, 2002, entitled "Electro-Osomotic Pumps and Micro-Channels".

* cited by examiner

ELECTROOSMOTIC PUMPS USING POROUS FRITS FOR COOLING INTEGRATED CIRCUIT STACKS

BACKGROUND

This invention relates generally to cooling stacks of integrated circuits.

Stacking of multiple integrated circuit chips may improve integrated circuit functionality, while at the same time reducing space requirements. As transistor dimensions shrink, the stacking of heat producing integrated circuits will increase heat dissipation problems. Conventional integrated circuit technologies may not be able to adequately remove the amount of heat generated from stacking a series of heat producing chips.

Thus, there is a need for better ways of cooling stacks of integrated circuits.

DETAILED DESCRIPTION

Figure 1:
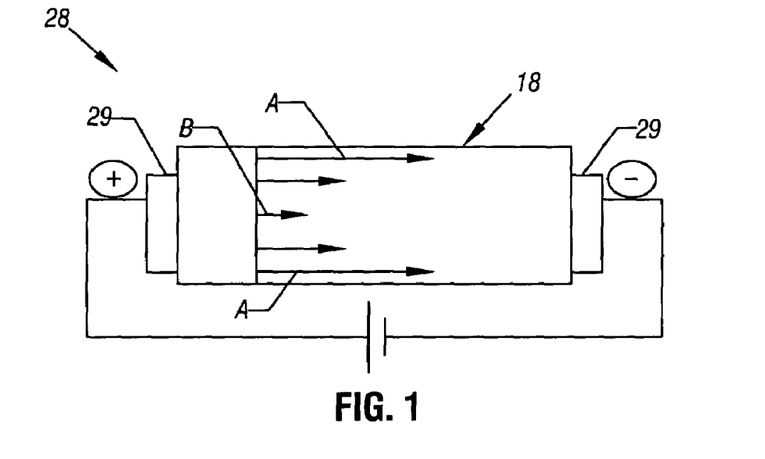
FIG. 1 is a schematic depiction of the operation of the embodiment in accordance with one embodiment of the present invention.

Referring to FIG. 1, an electroosmotic pump 28 fabricated in silicon is capable of pumping a fluid, such as a cooling fluid, through a frit 18. The frit 18 may be coupled on opposed ends to electrodes 29 that generate an electric field that results in the transport of a liquid through the frit 18. This process is known as the Electroosmotic effect. The liquid may be, for example, water and the frit may be composed of silicon dioxide in one embodiment. In this case hydrogen from hydroxyl groups on the wall of the frit deprotonate resulting in an excess of protons moving transversely to the wall or transversely to the direction of fluid movement, indicated by the arrows A. The hydrogen ions move in response to the electric field applied by the electrodes 29 in the direction of the arrows A. The non-charged water atoms also move in response to the applied electric field because of drag forces that exist between the ions and the water atoms.

As a result, a pumping effect may be achieved without any moving parts. In addition, the structure may be fabricated in silicon at extremely small sizes making such devices applicable as pumps for cooling integrated circuits.

In accordance with one embodiment of the present invention, the frit 18 may be made of an open and connected cell dielectric thin film having open nanopores. By the term "nanopores," it is intended to refer to films having pores on the order of 10 to 1000 nanometers. In one embodiment, the open cell porosity may be introduced using the sol-gel process. In this embodiment, the open cell porosity may be introduced by burning out the porogen phase. However, any process that forms a dielectric film having interconnected or open pores on the order of 10 to 1000 nanometers may be suitable in some embodiments of the present invention.

For example, suitable materials may be formed of organosilicate resins, chemically induced phase separation, and sol-gels, to mention a few examples. Commercially available sources of such products are available from a large number of manufacturers who provide those films for extremely low dielectric constant dielectric film semiconductor applications.

In one embodiment, an open cell xerogel can be fabricated with 20 nanometer open pore geometries that increase maximum pumping pressure by a few orders of magnitude. The xerogel may be formed with a less polar solvent such as ethanol to avoid any issues of water tension attacking the xerogel. Also, the pump may be primed with a gradual mix of hexamethyldisilazane (HMDS), ethanol and water to reduce the surface tension forces. Once the pump is in operation with water, there may be no net forces on the pump sidewalls due to surface tension.

Referring to FIGS. 2–9, the fabrication of an integrated electroosmotic pump 28 using a nanoporous open cell dielectric frit 18 begins by patterning and etching to define an electroosmotic trench.

Figure 2:
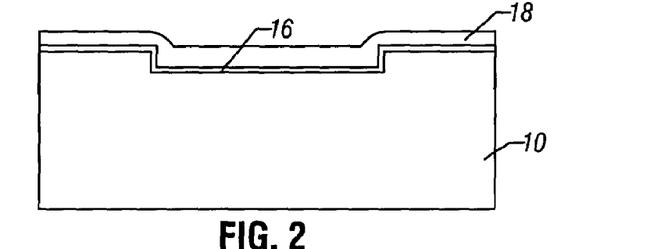
FIG. 2 is an enlarged cross-sectional view of one embodiment of the present invention at an early stage of manufacture.

Referring to FIG. 2, a thin dielectric layer 16 may be grown over the trench in one embodiment. Alternatively, a thin etch or polish-stop layer 16, such as a silicon nitride, may be formed by chemical vapor deposition. Other techniques may also be used to form the thin dielectric layer 16. The nanoporous dielectric layer 18 may than be formed, for example, by spin-on deposition. In one embodiment, the dielectric layer 18 may be in the form of a sol-gel. The deposited dielectric layer 18 may be allowed to cure.

Figure 3:
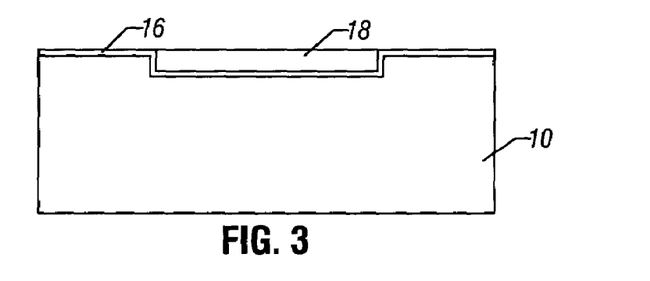
FIG. 3 is an enlarged cross-sectional view at a subsequent stage of manufacture in accordance with one embodiment of the present invention.

Then, referring to FIG. 3, the structure of FIG. 2 may be polished or etched back to the stop layer 16. As a result, a nanoporous dielectric frit 18 may be defined within the layer 16, filling the substrate trench.

Figure 4:
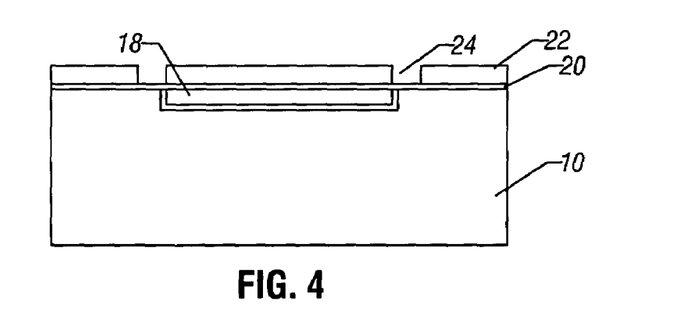
FIG. 4 is an enlarged cross-sectional view at a subsequent stage of manufacture in accordance with one embodiment of the present invention.

Referring next to FIG. 4, openings 24 may be defined in a resist layer 22 in one embodiment of the present invention. The openings 24 may be effective to enable electrical connections to be formed to the ends of the frit 18. Thus, the openings 24 may be formed down to a deposited oxide layer 20 that may encapsulate the underlying frit 18. In some embodiments, the deposited oxide layer 20 may not be needed.

Figure 5:
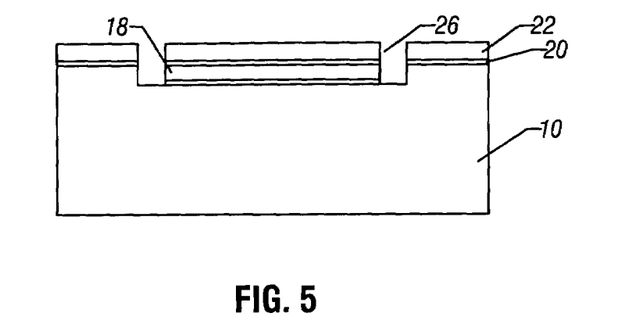
FIG. 5 is an enlarged cross-sectional view at a subsequent stage of manufacture in accordance with one embodiment of the present invention.
Figure 6:
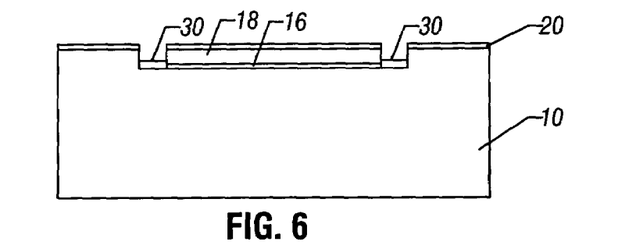
FIG. 6 is an enlarged cross-sectional view at a subsequent stage of manufacture in accordance with one embodiment of the present invention.

The resist 22 is patterned as shown in FIG. 4, the exposed areas are etched and then used as a mask to form the trenches 26 alongside the nanoporous dielectric layer 18 as shown in FIG. 5. Once the trenches 26 have been formed, a metal 29 may be deposited on top of the wafer. In one embodiment, sputtering can be used to deposit the metal. The metal 29 can be removed by etching or lift-off techniques in such a manner as to leave metal only in the trench at the bottom of the trenches 26 as shown in FIG. 6. The metal 29 is advantageously made as thin as possible to avoid occluding liquid access to the exposed edge regions of the frit 18, which will ultimately act as the entrance and exit openings to the pump 28. The metal 30 may be thick enough, however, to assure adequate current flow without damage to the electrodes. Additionally, it is advantageous if the metal 29 also is deposited along the edges of the frit to a thickness which does not block the pore openings. This assures a uniform electric field along the entire depth of the frit.

Figure 7:
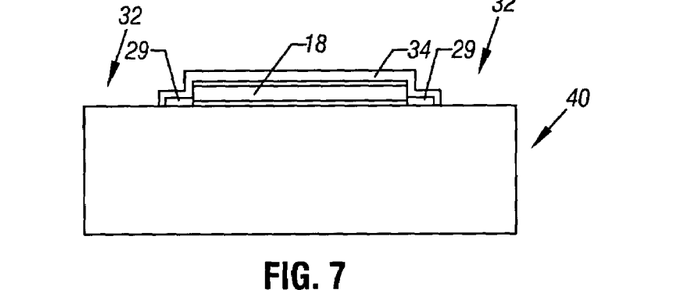
FIG. 7 is an enlarged cross-sectional view taken along the lines 7—7 in FIG. 8 at a subsequent stage of manufacture in accordance with one embodiment of the present invention.
Figure 8:
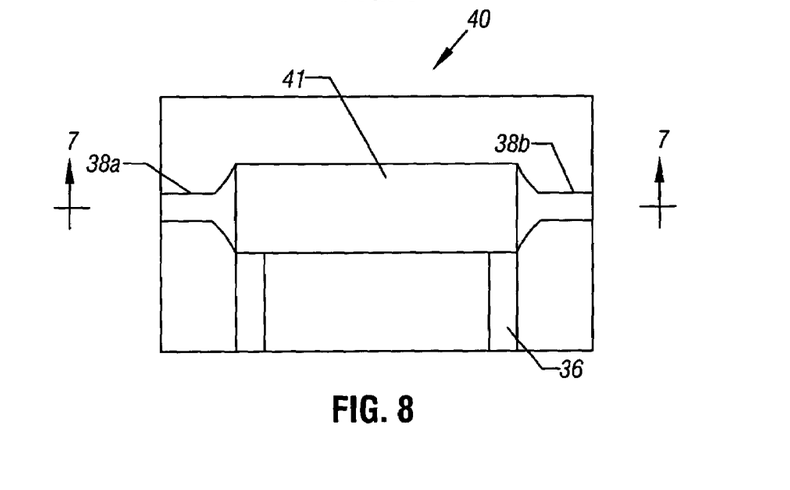
FIG. 8 is a top plan view of the embodiment shown in FIG. 8 in accordance with one embodiment of the present invention.

Referring to FIG. 7, a chemical vapor deposition material 34 may be formed over the frit 18 and may be patterned with photoresist and etched, as indicated at 32, to provide for the formation of microchannels 38 shown in FIG. 8. The microchannels 38 act as conduits to convey liquid to and from the rest of the pump 41. Also, electrical interconnections 36 may be fabricated by depositing metal (for example by sputtering), and removing the metal in selected areas (for example by lithographic patterning and etching across the wafer to enable electrical current to be supplied to the electrodes 29. This current sets up an electric field that is used to draw the fluid through the pump 28.

Figure 9:
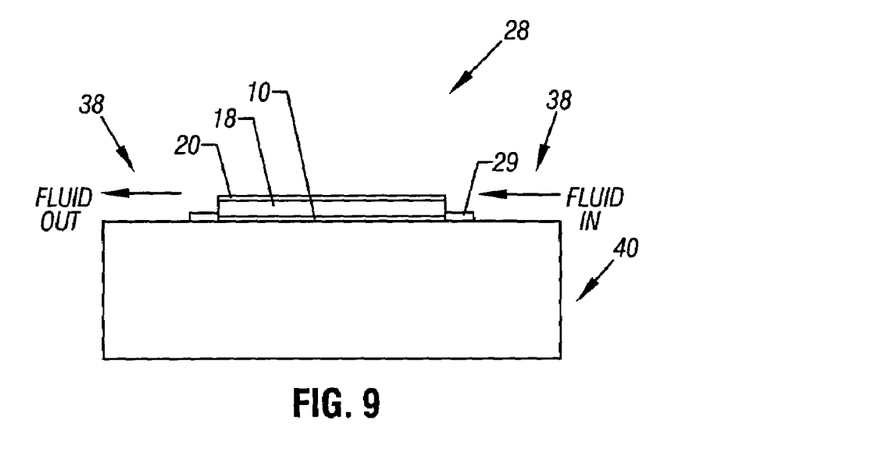
FIG. 9 is an enlarged cross-sectional view of a completed structure in accordance with one embodiment of the present invention.

Referring to FIG. 9, the fluid may pass through the microchannels 38 and enter the frit 18 by passing over the first electrode 29. The fluid is drawn through the frit 18 by the electric field and the disassociation process described previously. As a result, the fluid, which may be water, is pumped through the pump 28.

Figure 10:
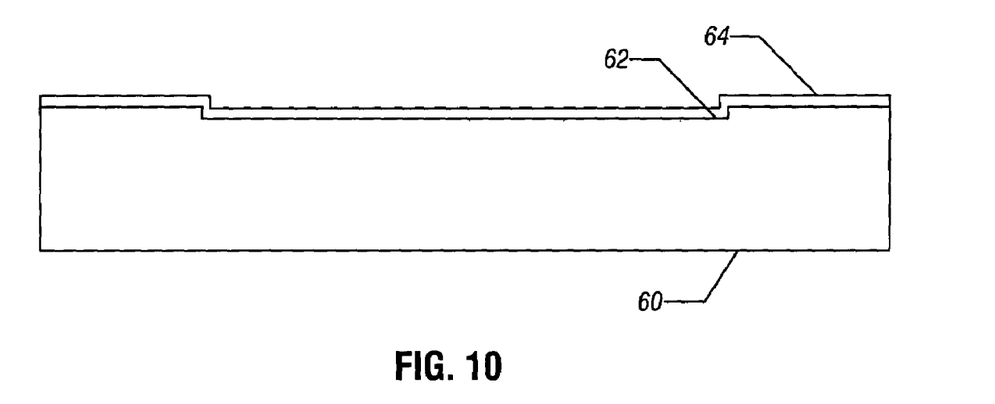
FIG. 10 is a depiction of a recombiner at an early stage of manufacture.
Figure 11:
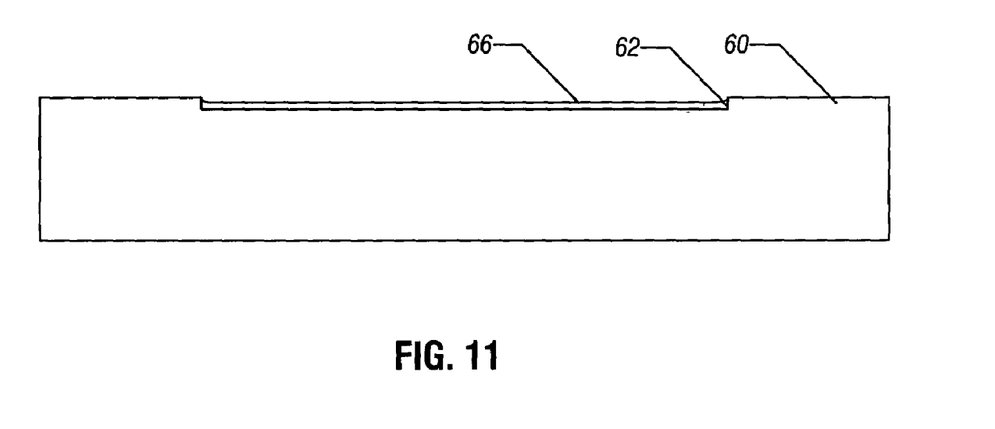
FIG. 11 is an enlarged cross-sectional view at a subsequent stage of manufacture in accordance with one embodiment of the present invention.
Figure 12:
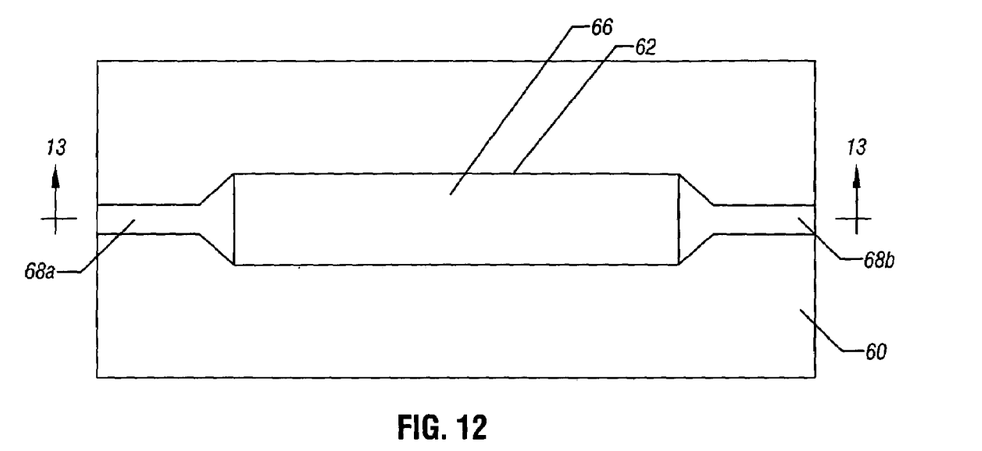
FIG. 12 is an enlarged top plan view at a subsequent stage of manufacture in accordance with one embodiment of the present invention.
Figure 13:
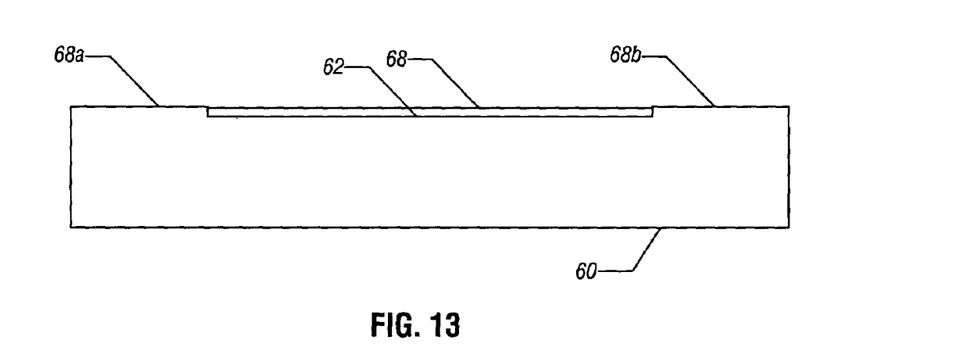
FIG. 13 is a cross-sectional view taken general along the line 13—13 in FIG. 12 in accordance with one embodiment of the present invention.

Referring now to FIGS. 10 through 17, one embodiment of a fabrication technique for making an integrated recombiner is illustrated. Initially, a semiconductor substrate 60, such as a silicon wafer, may have a trench 62 formed therein by patterning and etching techniques, for example. Thereafter, a catalyst material 64, such as platinum or lead, is sputter deposited as shown in FIG. 10. The catalyst material 64 is polished off the top of the wafer substrate 60 so only the portion 66 remains as shown in FIG. 11. A resist may be spun-on and patterned to form microchannels 68a and 68b, shown in FIGS. 12 and 13.

Figure 14:
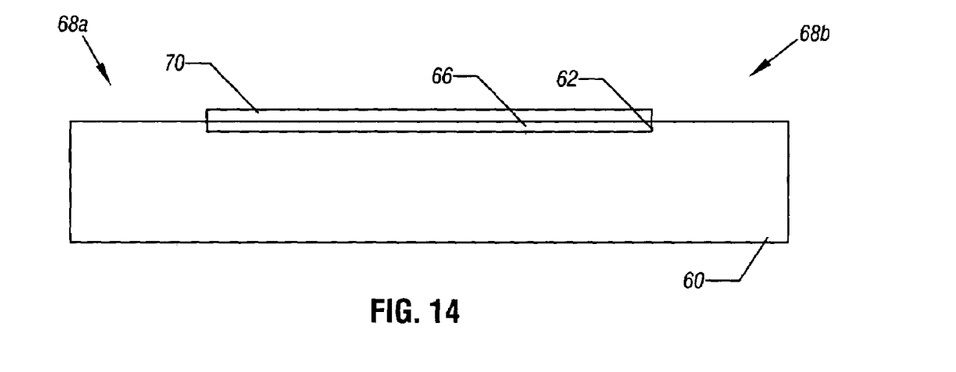
FIG. 14 is an enlarged cross-sectional view at a subsequent stage of manufacture in accordance with one embodiment of the present invention.
Figure 15:
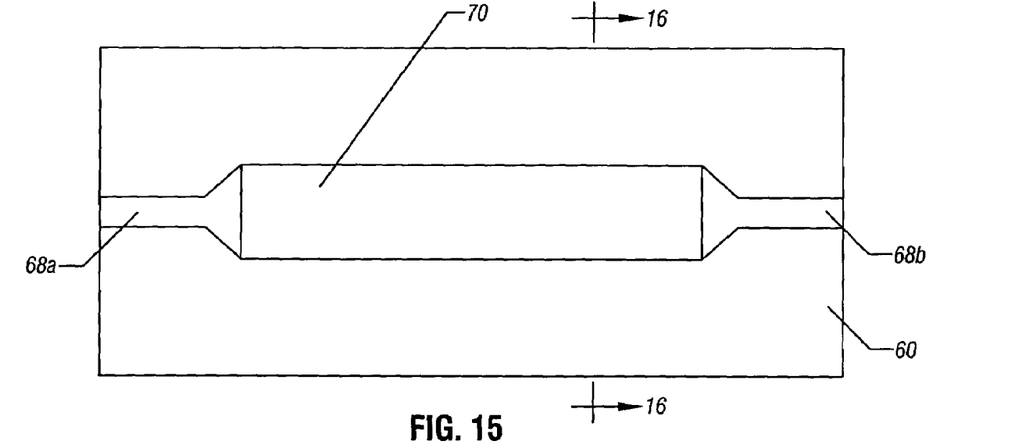
FIG. 15 is a top plan view of the embodiment shown in FIG. 14 at a subsequent stage of manufacture in accordance with one embodiment of the present invention.
Figure 16:
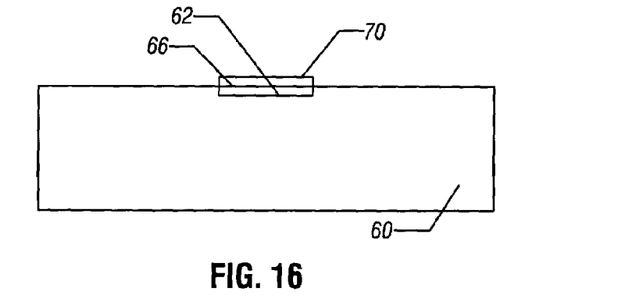
FIG. 16 is a cross-sectional view taken generally along the line 16—16 in FIG. 15 in accordance with one embodiment of the present invention.
Figure 17:
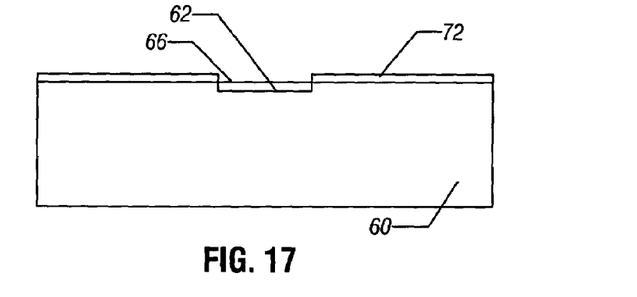
FIG. 17 is a cross-sectional view corresponding to FIG. 16 at a subsequent stage of manufacture in accordance with one embodiment of the present invention.

The microchannels 68a and 68b may be etched to the depth of the top of the catalyst material 66 and the resist used to do the etching may be cleaned. Then a resist 70 may be spun-on and ashed to clear the top of the wafer substrate 60, as shown in FIG. 14. A barrier, such as TiTiN, and copper 72 may be sputtered on top of the wafer substrate 60. A resist lift off may be used to remove the copper from the top of the catalyst material 66 and the microchannels 68a and 68b as shown in FIG. 17.

A porous Teflon layer (not shown) may be deposited over the wafer surface and either etched back or polished so that the Teflon covers the catalyst material 66 while having the copper 72 exposed. The Teflon layer protects the catalyst material 66 if re-combined gas turns into water.

Figure 17A:
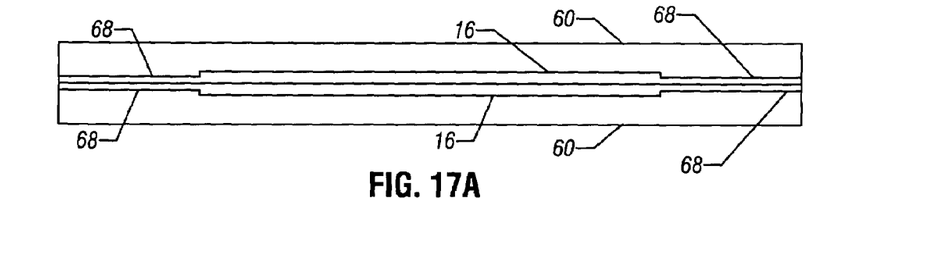
FIG. 17A is a side-elevational view of a re-combiner in accordance with one embodiment of the present invention.

A pair of identical substrates 60, processed as described above, may then be combined in face-to-face abutment to form a re-combiner 30 as shown in FIG. 17A. The substrates 60 may be joined by copper-to-copper bonding where there is no trench 16 or channel 68. Other bonding techniques, such as eutectic or direct bonding, may also be used to join the two wafers together. The trenches 16 and channels 68 may be aligned to form a passage for cooling fluid circulation over the catalyst material 66.

The re-combiner 30 may be used to reduce the buildup of gas in the cooling fluid pumped by the pump 28. Exposure of the gases to catalytic material 66 results in gas recombination. The re-combiner 30 may be made deep enough to avoid being covered with water formed from recombined gas.

Figure 18:
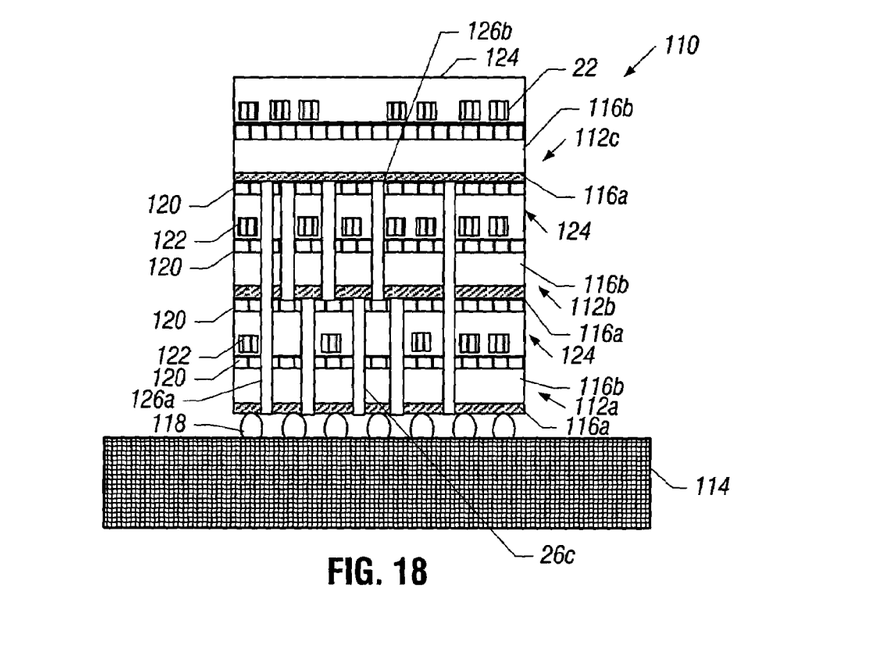
FIG. 18 is a cross-sectional view of a system in accordance with one embodiment of the present invention.

Referring to FIG. 18, a stack 110 may include alternating integrated circuits 112 and cooling chips 124. In particular, starting from the bottom, the integrated circuit 112a is coupled by surface mount connections 118 to a structure 114 such as a printed circuit board. Over the integrated circuit 112a is a cooling chip 124 which may include microchannels 122 for the circulation of cooling fluid. Above the cooling chip 124 is another integrated circuit 112b, followed by another cooling chip 124 and another integrated circuit 112c under another cooling chip 124. The exact number of alternating layers is subject to considerable variability.

Each integrated circuit 112 may be coupled to an overlying cooling chip 124 using a variety of bonding techniques in the wafer bonding layer 120. The wafer bonding layer 120 may be copper or oxide wafer bonding layers in some embodiments of the present invention. Eutectic bonding may also be employed.

Each integrated circuit 112 may have a specialized function and all the integrated circuits 112 may have the same function in one embodiment. Each integrated circuit 112 may include an active layer 116a and a bulk semiconductor substrate 116b.

Electrical connections may be made between the integrated circuits 112. For example, the electrical via 126a may couple the integrated circuit 112a and the integrated circuit 112c. The via 126b may couple the integrated circuits 112c and 112b. The electrical via 126c may couple the integrated circuit 112b with the integrated circuit 112a.

In some cases, some integrated electronics may be included on the cooling chips 124. For example, an integrated temperature sensor such as a thermister may be formed on the circuit as well as other control elements.

The microchannels 122 may be formed by techniques described previously in connection with the formation of the microchannels 68 and the trenches 16. Basically, the microchannels 122 circulate cooling fluid through the cooling chips 124 for cooling the proximate integrated circuits 112. The number and placement of these cooling channels 122, as well as their orientation, is subject to considerable variability.

Figure 19:
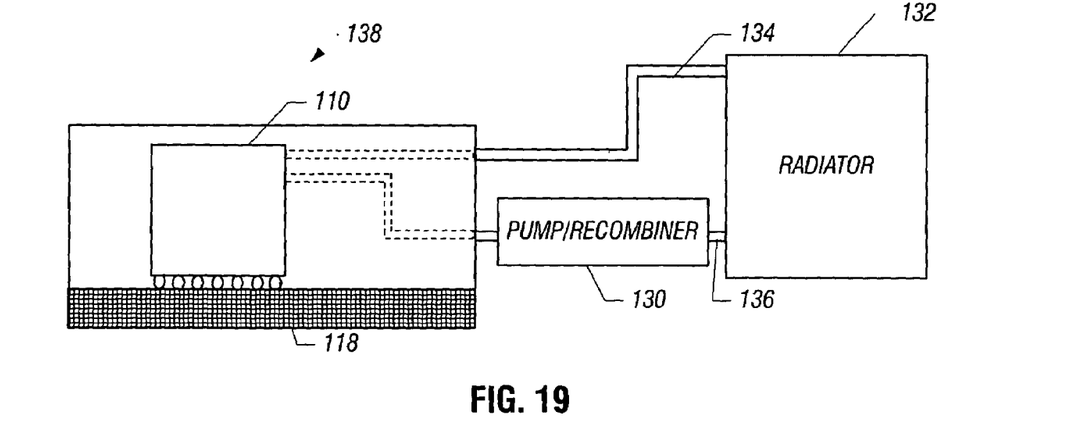
FIG. 19 is a schematic view of a packaged system in accordance with one embodiment of the present invention.

Referring to FIG. 19, the stack 110 from FIG. 18 may be entirely contained within a package 138 mounted on a support structure 118. External to the package 138 is a pump and re-combiner unit 130. In one embodiment, the re-combiner can be made as described previously and may be formed on an integrated circuit. Lines 136 and 134 couple the pump and re-combiner 130 to the stack 110 and a radiator 132 for heat dissipation. As shown in FIG. 19, the lines 134 and 136 may be tubing such as plastic or metal tubes.

Figure 20:
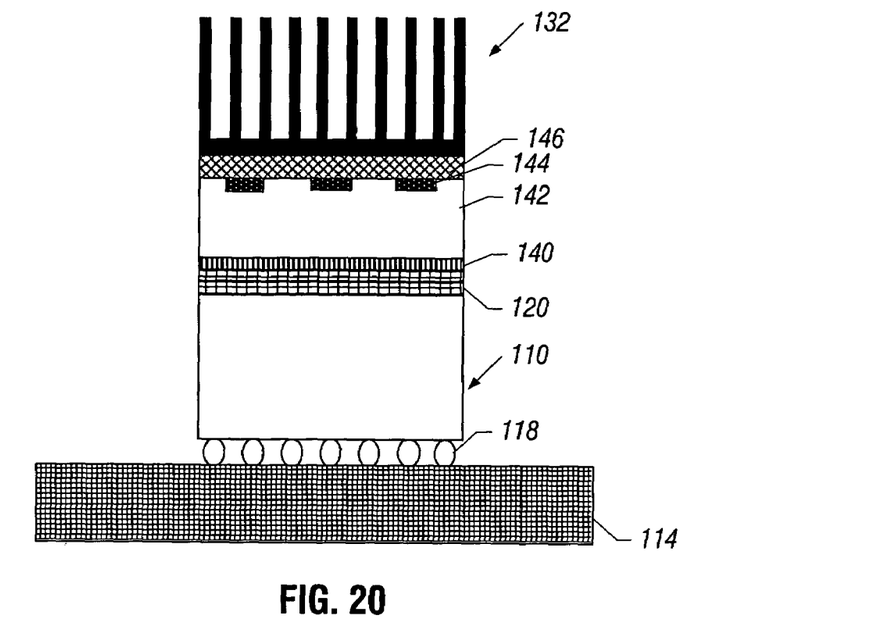
FIG. 20 is a cross-sectional view of a packaged system in accordance with another embodiment of the present invention.

Referring to FIG. 20, in accordance with another embodiment, the stack 110 may be integrated within a stack as well. In this case, the stack 110 may be coupled to a bonding layer 120, such as a copper bonding layer. The bonding layer 120 may be coupled to a glass layer 140 used to insulate the upper portion of a stack from the overlying structure 142. The structure 142 may include electroosmotic pumps 18 formed therein in order to supply the cooling fluid to the microchannels 122. The copper heat sink 146 may be located over the pumps 18. The copper heat sink 146 may work to provide for heat dissipation through a thinned heat sink 132. Fluid flow from the pumps 18 may be conveyed by vertical channels formed as vias through the structure 142 to communicate with the underlying microchannels 122.

Figure 21:
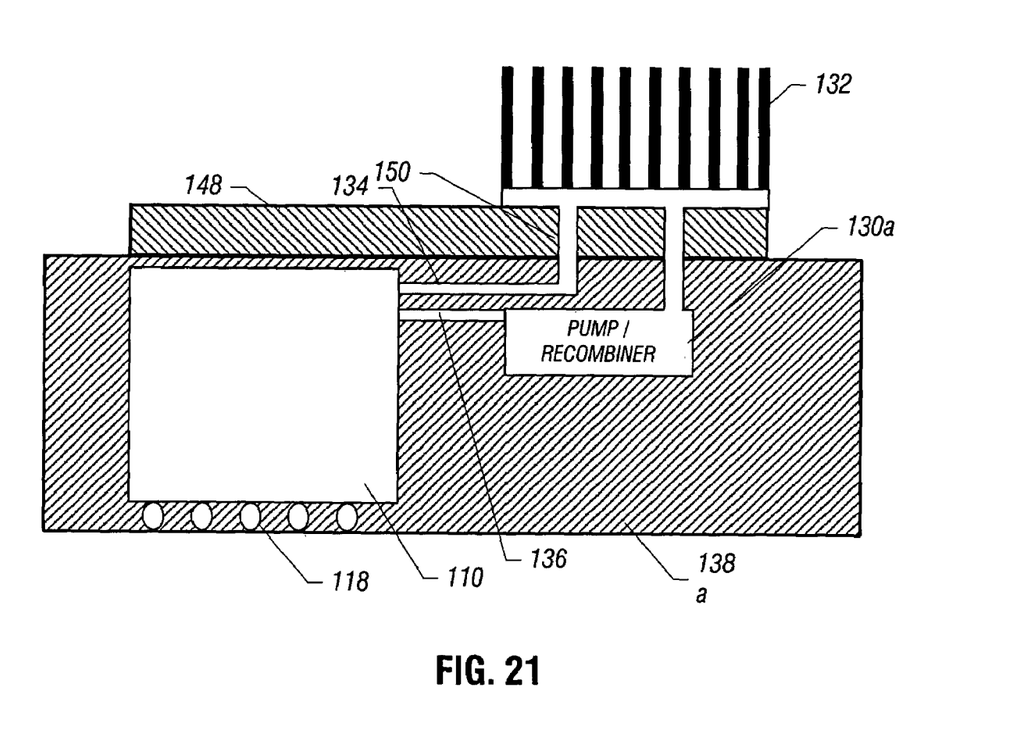
FIG. 21 is a cross-sectional view of a packaged system in accordance with another embodiment of the present invention.

Turning next to FIG. 21, in this case, the stack 110 is contained entirely within the package 138, together with the pump/re-combiner 130a. Again, the pump/re-combiner 130a may be formed using the techniques illustrated in FIGS. 1–17A and may be an integrated circuit coupled by channels 136 and 150 to the microchannels 122 within the stack 110. A fluid pipe 136 goes from stack 110 to the pump re-combiner 130a. Another pipe 135 leads from the pump re-combiner 130a to the radiator 132. Still another pipe 134 leads from the radiator back to the stack 110. The fluid circulates in a loop from the pump 130a to the stack 110 to the radiator 132 to dissipate heat. Also, having the heat sink 132 separated from the stack 110 may achieve a greater difference in temperature between the heat sink 132 and the stack 110, resulting in more heat dissipation. In one embodiment, the layer 148 may be a series of build-up layers formed in silicon.

Figure 22:
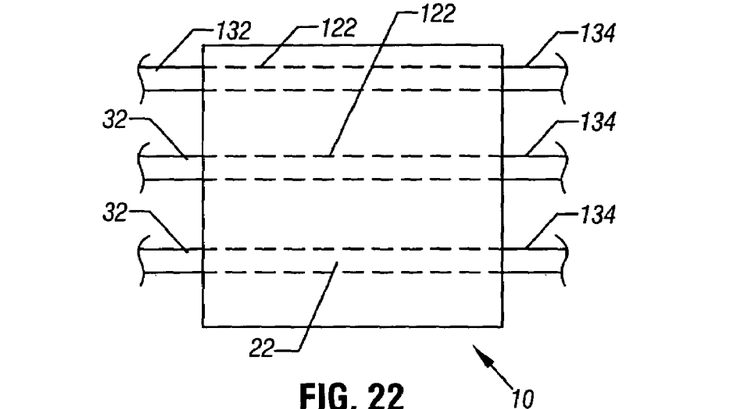
FIG. 22 is a schematic view of a cooling system in accordance with another embodiment of the present invention.

Referring to FIG. 22, the flow of fluid through channels 122 may be subject to considerable variability. For example, each of the channels 122 may receive a fluid input 134 and may pass a fluid output 132 back to a pump or re-combiner. Thus, in such case, the fluid flow through each cooling chip 124 may be substantially parallel.

Figure 23:
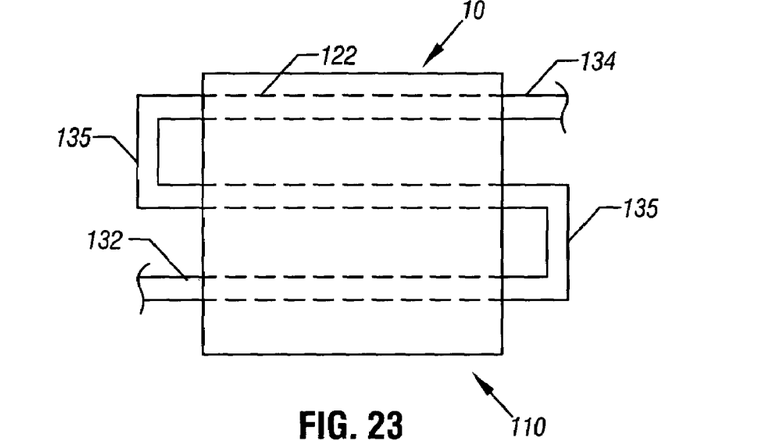
FIG. 23 is a schematic view of still another embodiment of the present invention.

Referring to FIG. 23, the fluid flow through the cooling chips 124 may be arranged in a serial fashion where the flow proceeds from one cooling chip 124 to another through connecting elements 135. While the connecting elements 135 are shown as being external to the stack 110, they may also be internal, formed as vias connecting the channels in one chip 124 to the channels 122 in a lower chip 24, in one embodiment of the present invention.

Figure 24:
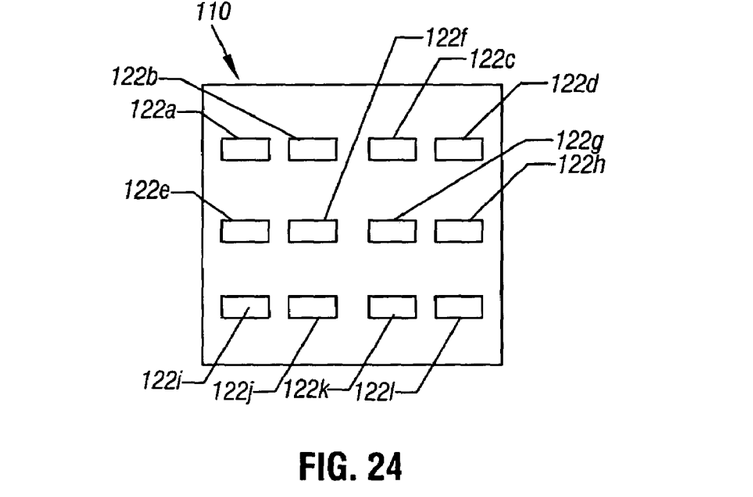
FIG. 24 is a schematic view of still another embodiment of the present invention.

Referring to FIG. 24, in accordance with one embodiment of the present invention, a series of channels 122a through 122d in one cooling chip 124 may be arranged over a series of channels 122e through 122h in another chip 124, in turn arranged over a series of channels 122i through 122l in still another chip 124.

Figure 25:
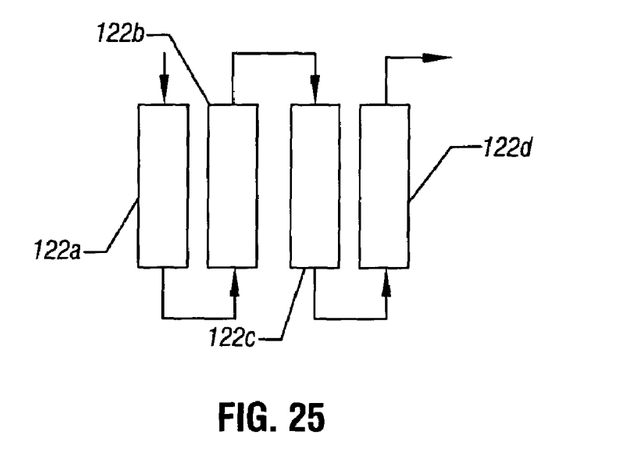
FIG. 25 is a schematic view of still another embodiment of the present invention.
Figure 26:
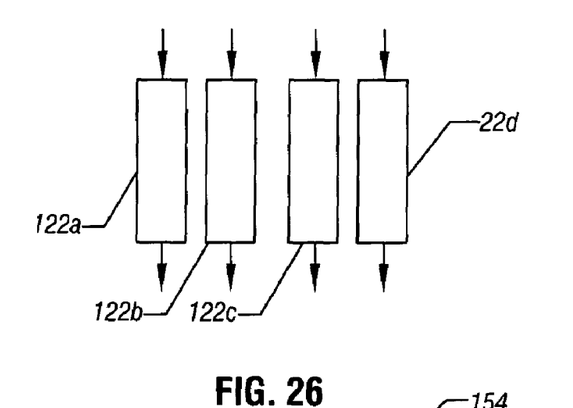
FIG. 26 is a schematic view of still another embodiment of the present invention.

Referring to FIG. 25, each of the sets of channels 122 in any given chip 124, such as the channels 122a through 122d, may be arranged to provide for serial flow as indicated. The serial flow may be simply formed by channels formed within the chip 124 itself. Alternatively, the flow through any given layer, such as the layer including the channels 122a through 122d, may be parallel as suggested in FIG. 26. Thus, the flow within any given chip 124 may be serial or parallel and the flow from chip 124 to chip 124 may be serial or parallel in some embodiments of the present invention.

Figure 27:
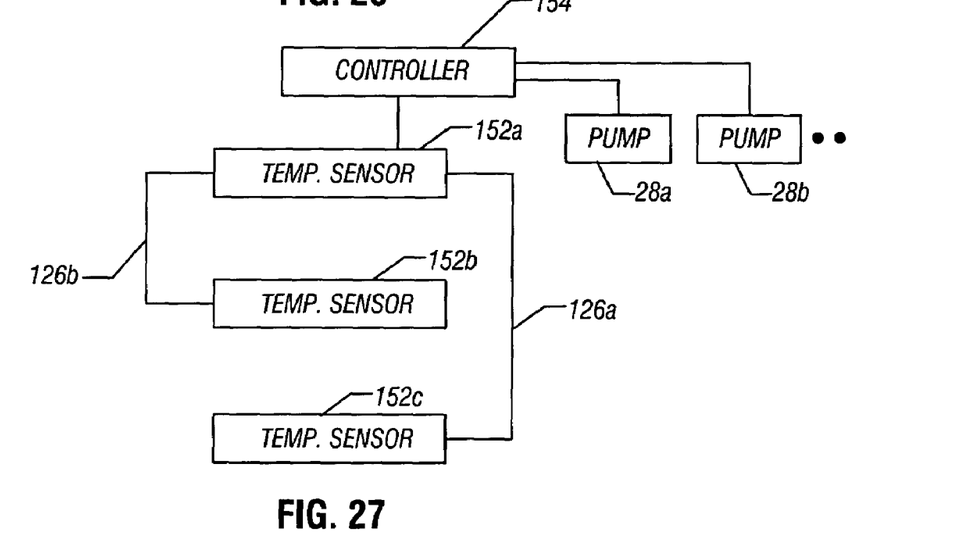
FIG. 27 is a schematic view of still another embodiment of the present invention.

Referring to FIG. 27, in accordance with one embodiment of the present invention, a controller 154 may be integrated into one of the cooling chips 124 in one embodiment of the present invention. The controller 154 electrically communicates with temperature sensors 152 contained in each cooling chip 124. The temperature sensors 152 sense the local temperature and indicate whether cooling is needed or not. When cooling is needed, the flow of fluid may be provided. For example, fluid flow may be provided through one layer and not another layer in one embodiment of the present invention. In such case where only one integrated circuit 112 is in need of cooling, the cooling flow may be controlled to pass the cooling fluid in the cooling chip 124 associated with the hot integrated circuit 112.

This temperature responsive cooling control may be provided in a number of ways. One way to do so is to provide a number of electroosmotic pumps 28, each associated with one or more cooling channels. Those electroosmotic pumps may be either operated or not operated based on signals from the controller 154. Thus, relatively fine control of how much cooling is provided and where that cooling is provided may be facilitated in some embodiments of the present invention.

In accordance with some embodiments of the present invention, the stack 110 may be effectively edge sealed so that the stack 110 may be partially immersed in a liquid. However, because of the hermetic sealing of the edge regions of the stack 110, the liquid may only enter the stack 110 through ports which communicate with the microchannels 122 formed in the cooling chips 124.

Figure 28:
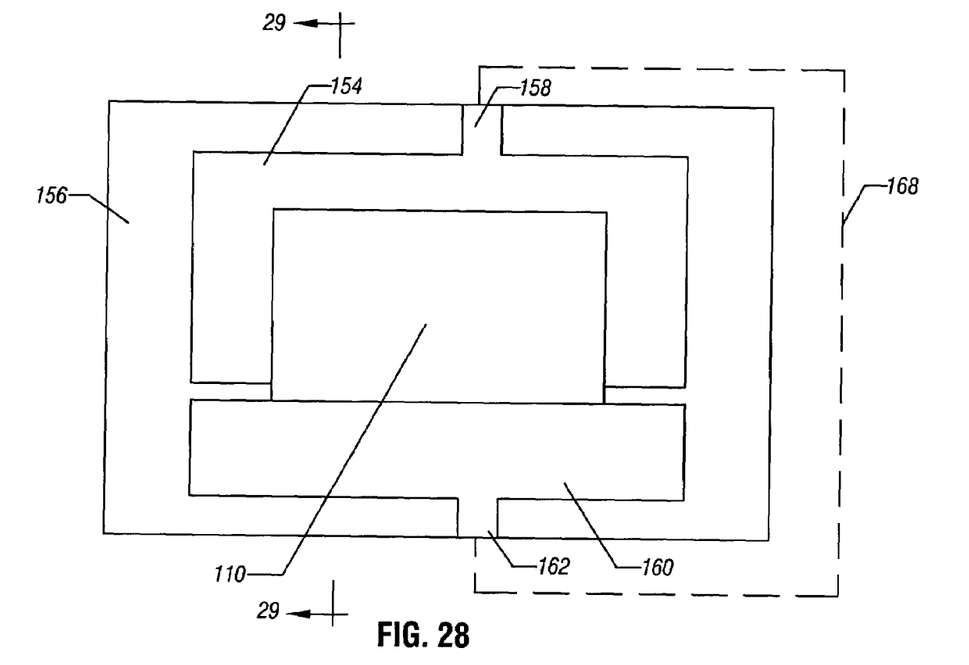
FIG. 28 is an enlarged, cross-sectional view through one embodiment of the present invention taken generally along the line 28—28 in FIG. 29.

For example, referring to FIG. 28, a package 156 may have a first trench 154 and a second trench 160 which are isolated from one another. Interior edges of the trenches 154, 160 are defined by the stack 110 which is inserted into the package 156. The trenches 154 and 160 may communicate with ports 158 and 162 which allow fluid to be added or exhausted from the package exterior. The edges of the stack 110 are in communication with the fluid filled trench 154. Fluid from the fluid filled trench 154 may enter the stack 110 and may leave through the fluid filled trench 160. Fluid may be recirculated by tubing 168 which connects the ports 162 and 158.

Figure 29:
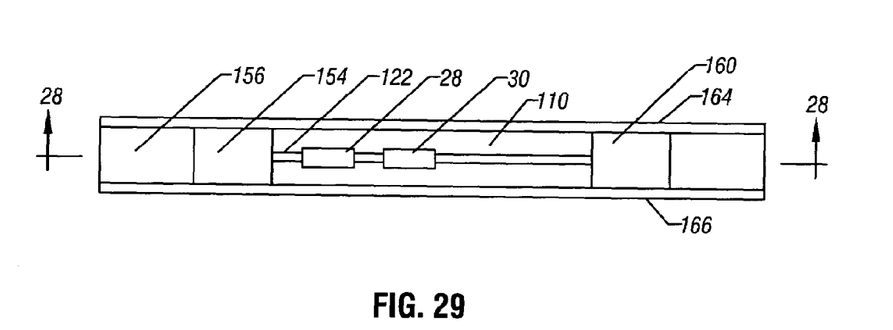
FIG. 29 is a cross-sectional view taken generally along the line 29—29 in FIG. 28 in accordance with one embodiment of the present invention.

Referring to FIG. 29, the fluid filled trench 154 may fluidically communicate with one or more microchannels 122, that in turn communicate with one or more electroosmotic pumps 28 and re-combiners 30. In this way, fluid may be pumped by the electroosmotic pump 28 for selective cooling of hot areas of the multichip stack 110. Upper and lower covers 164 and 166 may be included on the package in one embodiment of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A packaged integrated circuit structure comprising:
   a pair of heat generating integrated circuit chips;
   a cooling integrated circuit chip between said pair of heat generating integrated circuit chips, said cooling integrated circuit chip including an integrated electroosmotic pump and microchannels for the circulation of a cooling fluid; and
   a package containing said integrated circuit chips.

2. The structure of claim 1 including integrated re-combiners in said cooling integrated circuit chip.

3. The structure of claim 1 wherein the edges of said heat generating integrated circuit chips are sealed.

4. The structure of claim 1 including electrical vias coupling said integrated circuit chips.

5. The structure of claim 1 including a controller, electroosmotic pumps, and temperature sensors within said integrated circuit chips to selectively operate said electroosmotic pumps to cool particular regions of said heat generating integrated circuit chips.

6. The structure of claim 1 including a first trench for containing a fluid so as to communicate from the exterior of said cooling integrated circuit chip with said microchannels.

7. The structure of claim 6 including a second trench isolated from said first trench and abutting said cooling integrated circuit chip in said package.

8. The structure of claim 7 wherein said second trench to contain fluid and to fluidically communicate with said microchannels.

9. The structure of claim 8 including ports to communicate with said first trench and said second trench from the exterior of said package.

10. The structure of claim 9 wherein said ports are connected exteriorly of said package.

11. A packaged integrated circuit structure comprising:
   a stack including a pair of integrated circuit chips, a first cooling integrated circuit chip between said pair of integrated circuit chips, a second cooling integrated circuit chip on one of said integrated circuit chips, said first and second cooling integrated circuit chips including microchannels for the circulation of a cooling fluid;
   a package receiving said stack, said package having formed therein an inlet fluid reservoir and an outlet fluid reservoir to communicate with said microchannels; and
   a path to recycle fluid from said outlet fluid reservoir to said inlet fluid reservoir.

12. The structure of claim 11 including a path on the exterior of said package.

13. The structure of claim 11 wherein the edges of said integrated circuit chips are sealed.

14. The structure of claim 11 including a plurality of temperature sensors to enable temperature controlled cooling.

15. The structure of claim 11 wherein said stack is in contact with said fluid reservoirs.

16. The structure of claim 15 wherein said microchannels communicate with the edges of said cooling integrated circuit chip.

17. The structure of claim 11 including electroosmotic pumps in said cooling integrated circuit chip.

18. The structure of claim 17 including a re-combiner coupled to each of said electroosmotic pumps.

19. The structure of claim 17 wherein said electroosmotic pumps may be selectively operated to provide localized cooling.

20. A packaged integrated circuit structure comprising:
   a pair of heat generating integrated circuit chips including temperature sensors within said integrated circuit chips;
   a cooling integrated circuit chip between said pair of heat generating integrated circuit chips, said cooling integrated circuit chip including microchannels for the circulation of a cooling fluid;
   a package containing said integrated circuit chips; and
   a controllers; and
   electroosmotic pumps, said temperature sensors to selectively operate said electroosmotic pumps to cool particular regions of said heat generating integrated circuit chips.

21. A packaged integrated structure comprising:
   a pair of heat generating integrated circuit chips; and
   a cooling integrated circuit chip between said pair of heat generating integrated circuit chips, said cooling integrated circuit chip including microchannels for the circulation of a cooling fluid, said cooling integrated circuit chip including a first trench for containing the fluid so as to communicate from the interior of said cooling integrated circuit chip with said microchannels, said cooling integrated circuit chip including a second trench isolated from said first trench and abutting said cooling integrated circuit chip in said package.

22. The structure of claim 21 wherein said second trench to contain fluid and to fluidically communicate with said microchannels.

23. The structure of claim 22 including ports to communicate with said first trench and said second trench from the interior of said package.

24. The structure of claim 23 wherein said ports are connected exteriorly of said package.

* * * * *